(12) United States Patent
Kao et al.

(10) Patent No.: US 8,536,573 B2
(45) Date of Patent: Sep. 17, 2013

(54) PLATING PROCESS AND STRUCTURE

(75) Inventors: Chin-Fu Kao, Taipei (TW); Cheng-Lin Huang, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 19 days.

(21) Appl. No.: 13/310,448

(22) Filed: Dec. 2, 2011

(65) Prior Publication Data

US 2013/0140563 A1 Jun. 6, 2013

(51) Int. Cl.
*H01L 23/58* (2006.01)
*H01L 23/48* (2006.01)

(52) U.S. Cl.
USPC 257/48; 257/693; 257/E23.011; 257/E23.141

(58) Field of Classification Search
CPC .............. H01L 23/5276; H01L 2924/01079
USPC ............ 257/48, 693, 774, E23.011, E23.141
See application file for complete search history.

(56) References Cited

U.S. PATENT DOCUMENTS

| | | | |
|---|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |

(Continued)

*Primary Examiner* — A. Sefer
*Assistant Examiner* — Nikolay Yushin
(74) *Attorney, Agent, or Firm* — Slater & Matsil, L.L.P.

(57) ABSTRACT

A system and method for plating a contact connected to a test pad is provided. An embodiment comprises inserting a blocking material into vias between the contact and the test pad. In another embodiment a blocking structure may be inserted between the contact and the test pad. In yet another embodiment a blocking layer may be inserted into a contact stack. Once the blocking material, the blocking structure, or the blocking layer have been formed, the contact may be plated, with the blocking material, the blocking structure, or the blocking layer reducing or preventing degradation of the test pad due to galvanic effects.

20 Claims, 6 Drawing Sheets

(56) References Cited

U.S. PATENT DOCUMENTS

| | | |
|---|---|---|
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2007/0114671 A1* | 5/2007 | Hsu et al. ............ 257/774 |
| 2009/0057726 A1* | 3/2009 | Ohnuma et al. ...... 257/255 |
| 2011/0024901 A1* | 2/2011 | Yamashita et al. ... 257/737 |
| 2012/0146085 A1* | 6/2012 | Park et al. ............ 257/99 |

* cited by examiner

PLATING PROCESS AND STRUCTURE

BACKGROUND

Generally, multiple semiconductor dies may be manufactured concurrently with each other by forming the dies at the same time on a semiconductor wafer. The semiconductor dies may contain multiple devices such as transistors, resistors, capacitors, inductors, and the like, using, e.g., a combination of implantation, deposition, masking, etching, annealing, and passivating steps during the manufacturing process. Once formed, these devices may be connected to each to form functional units and circuits using alternating layers of metallization and dielectric layers. Contacts may be formed in connection with the metallization layers in order to provide an external connection between the devices within the semiconductor dies and the individual semiconductor dies may be singulated from the wafer so that the semiconductor dies may be integrated as part of a larger system.

Additionally, at some point during the manufacture of the semiconductor dies, it may be desirable to test the semiconductor dies and determine if the semiconductor dies are suitable for further processing. To provide inputs to the semiconductor dies for the tests, special test pads may be manufactured on the semiconductor wafer in order to provide an electrical contact point for a test probe. These test pads may be formed to electrically connect to the same electrical points as respective contact pads, thereby providing an alternate electrical path to the underlying devices formed within the semiconductor dies.

During testing, the test probes may be placed into contact with the test pads in order to provide external connections to the semiconductor die. These external connections may be used to input a predetermined series of test signals or else to receive output from the semiconductor die after they have processed the signals that were input. These output signals may then be analyzed to determine whether the individual semiconductor dies have passed the test.

BRIEF DESCRIPTION OF THE DRAWINGS

For a more complete understanding of the embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a method of plating a contact that is connected to a test pad on a semiconductor device. The embodiments may also be applied, however, to other plating methods.

Figure 1:
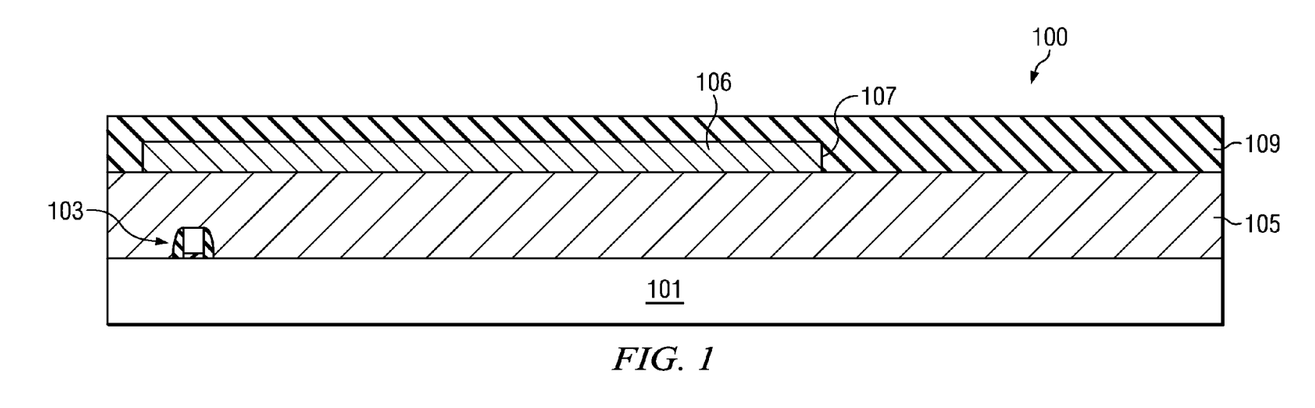
FIG. 1 illustrates a semiconductor device with a upper metallization layer in accordance with an embodiment.

With reference now to FIG. 1, there is shown a semiconductor device 100 with a substrate 101, active devices 103, intermediate metallization layers 105, an upper metallization layer 107, and an ILD layer 109 over the upper metallization layer 107. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include glass substrates, multi-layered substrates, gradient substrates, or hybrid orientation substrates.

The active devices 103 are represented on FIG. 1 as a single transistor on the substrate 101. However, as one of ordinary skill in the art will recognize, a wide variety of passive and active devices such as transistors, capacitors, resistors, inductors, combinations of these, or the like may be used to generate the desired structural and functional requirements of the overall design of the semiconductor device 100. The active devices 103 may be formed using any suitable methods either within or on the surface of the substrate 101.

The intermediate metallization layers 105 may be formed over the active devices 103 and are designed to connect the various active devices 103 to form functional circuitry. The intermediate metallization layers 105 may also be used to connect the active devices 103 to a contact 311 (discussed further below with respect to FIG. 3) so that the active devices 103 may receive inputs or send outputs through the contact 311. The intermediate metallization layers 105 may be formed of alternating layers of dielectric (e.g., low-k dielectric material) and conductive material (e.g., copper) and may be formed through any suitable process (such as deposition, damascene, dual damascene, etc.).

The upper metallization layer 107 may be formed over and in electrical contact with the conductive material within the intermediate metallization layers 105 in order to provide a connection between the active devices 103 and the contact 311. Additionally, the upper metallization layer 107 may also connect the active devices 103 to a test pad 309 (not shown in FIG. 1 but illustrated and discussed further below with respect to FIG. 3), providing an alternative path for signals while the semiconductor device 100 is being tested. The upper metallization layer 107 may be formed of a first conductive material 106 with a first reduction potential. In an embodiment, the first conductive material 106 may comprise copper, which has a reduction potential of −0.34 V. However, any other suitable conductive material, such as tungsten, aluminum, or the like, may alternatively be utilized. In an embodiment in which the first conductive material 106 is copper, the upper metallization layer 107 may be formed by initially forming a seed layer (not individually shown in FIG. 1) of a titanium copper alloy through a suitable formation process such as CVD or sputtering. A first photoresist (not shown in FIG. 1) may then be formed to cover the seed layer, and the first photoresist may then be patterned to expose those portions of the seed layer that are located where the upper metallization layer 107 is desired to be located.

Once the first photoresist has been formed and patterned, the first conductive material 106 (e.g., copper), may be formed on the seed layer through a deposition process such as plating. The first conductive material 106 may be formed to have a thickness of between about 1 μm and about 15 μm, such as about 5 μm. However, while the methods discussed are suitable to form the first conductive material 106 and the upper metallization layer 107, these methods are merely exemplary. Any other suitable processes of formation, such as CVD or PVD, may alternatively be used to form the upper metallization layer 107.

Once the first conductive material 106 has been formed, the first photoresist may be removed through a suitable removal process. In an embodiment the first photoresist may be removed through a process such as a dry process plasma ashing or a wet process chemical stripping, whereby the plasma and chemicals continue the reaction until the first photoresist has been removed. Additionally, after the removal of the first photoresist, those portions of the seed layer that were covered by the first photoresist may be removed through, for example, a suitable etch process using the first conductive material 106 as a mask.

After the upper metallization layer 107 has been formed, the ILD layer 109 may be formed over the upper metallization layer 107 in order to protect the upper metallization layer 107 and other underlying structures. The ILD layer 109 may be formed over the upper metallization layer 107 and may comprise an oxide that may be formed either by chemical vapor deposition (CVD) techniques using tetra-ethyl-ortho-silicate (TEOS) and oxygen as a precursor, or else by plasma enhanced chemical vapor deposition (PECVD). However, other methods and materials known in the art may be used. In an embodiment, the ILD layer 109 may be between about 4,000 Å and about 13,000 Å in thickness, but other thicknesses may be used. The surface of the ILD layer 109 may be planarized, such as by a CMP process using an oxide slurry.

Figure 2:
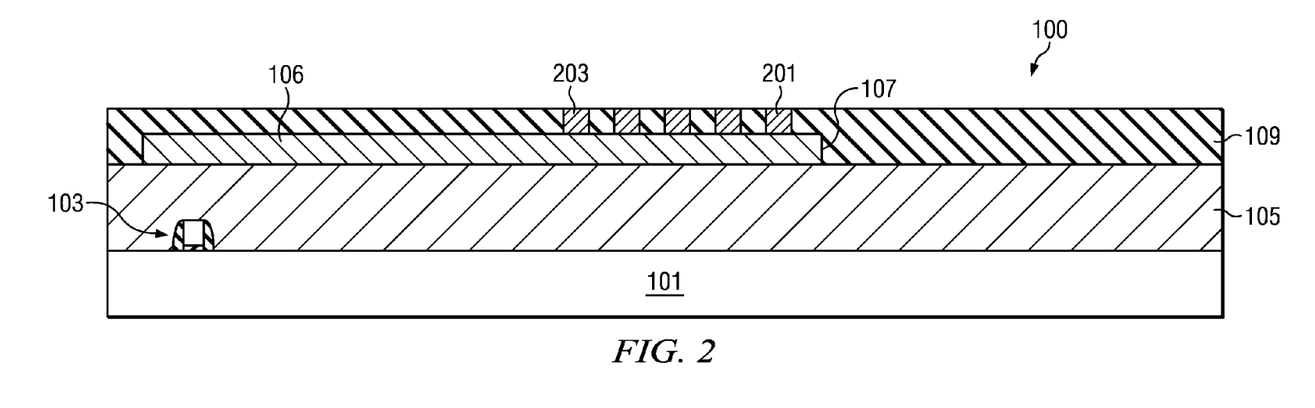
FIG. 2 illustrates the formation of vias to the upper metallization layer in accordance with an embodiment.

FIG. 2 illustrates the formation of vias 201 through the ILD layer 109 to make electrical contact to the upper metallization layer 107. In an embodiment the vias 201 may comprise a second conductive material 203 that has either a lower reduction potential than the first conductive material 106 or a higher reduction potential than a third conductive material 313 (discussed further below with respect to FIG. 3), thereby having a reduction potential outside of a range of reduction potentials between the first conductive material 106 and the third conductive material 313. By choosing the second conductive material 203 to have a lower reduction potential than the first conductive material 106, the increase in reduction potential from the second conductive material 203 (in the vias 201) to the first conductive material 106 (located in the upper metallization layer 107) may be used as a block in order to help prevent or reduce a flow of electrons in a galvanic circuit formed during a plating process. Alternatively, by choosing the second conductive material 203 to have a higher reduction potential than the subsequently formed third conductive material 313, the increase in reduction potential from the third conductive material 313 (in, e.g., a redistribution line 303, not shown in FIG. 2 but illustrated and discussed further below with respect to FIG. 3) to the second conductive material 203 (in the vias 201) may also be used as a block in order to help prevent or reduce the flow of electrons in a galvanic circuit formed during a plating process.

In an embodiment in which the first conductive material 106 is copper and the third conductive material 313 is, e.g., aluminum, the second conductive material 203 in the vias 201 may comprise magnesium (with a reduction potential of 2.38 V), gold (with a reduction potential of −1.52 V), silver (with a reduction potential of −0.8 V), platinum (with a reduction potential of −1.2 V), combinations of these, or the like. However, other materials, such as titanium (Ti) or magnesium (Mg), may alternatively be used depending upon the reduction potentials of the first conductive material 106 and the third conductive material 313.

The vias 201 may be formed, e.g., by forming openings for the vias 201 through the ILD layer 109 using, e.g., a suitable photolithographic mask and etching process. After the openings through the ILD layer 109 for the vias 201 have been formed, the vias 201 may be formed using a deposition process such as chemical vapor deposition (CVD), although any other suitable process, such as physical vapor deposition (PVD), plasma enhanced chemical vapor deposition (PECVD), ALD, or any other suitable process, may alternatively be utilized. Once the openings through the ILD layer 109 for the vias 201 have been filled with the second conductive material 203, any excess second conductive material 203 outside of the openings through the ILD layer 109 for the vias 201 may be removed, and the vias 201 and the ILD layer 109 may be planarized using, for example, a CMP process.

Figure 3:
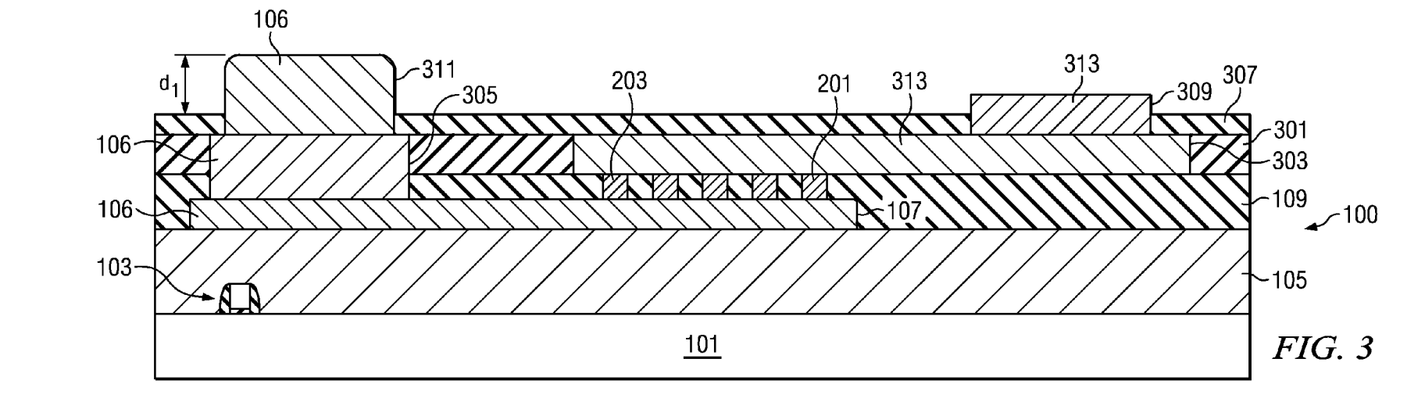
FIG. 3 illustrates the formation of a test pad and a contact on the semiconductor device in accordance with an embodiment.

FIG. 3 illustrates that, after the vias 201 have been formed, a first passivation layer 301 may be formed in order to electrically isolate and protect the vias 201 and other underlying structures. In an embodiment the first passivation layer 301 may be formed from a polymer such as polyimide, or may alternatively be formed of materials such as silicon oxides, silicon nitrides, low-k dielectrics, extremely low-k dielectrics, combinations of these, and the like. The first passivation layer 301 may be formed to have a thickness of between about 2 μm and about 15 μm, such as about 5 μm.

After the first passivation layer 301 has been formed, a redistribution line 303 may be formed in the first passivation layer 301 in order to provide a connection between the vias 201 and the test pad 309 (discussed further below). The redistribution line 303 may be formed of a third conductive material 313 that has a larger reduction potential than the first conductive material 106, such as aluminum, which has a reduction potential of 1.66 V. However, any other suitable conductive material that has a larger reduction potential than the first conductive material 106 (e.g., copper) may alternatively be utilized and remain within the scope of the present embodiments.

In an embodiment in which the third conductive material 313 in the redistribution line 303 is aluminum, the redistribution line 303 may be formed by initially forming an opening through the first passivation layer 301 using, e.g., a photolithographic masking and etching process, and then depositing the third conductive material 313 into the opening through the first passivation layer 301 using, for example, CVD. The redistribution line 303 may be formed to a thickness of between about 0.1 μm and about 100 μm, such as about 0.3 μm.

However, as one of ordinary skill in the art will recognize, the above described process steps are merely one method that may be used to form the vias 201 and the redistribution line

303. Other methods, such as a forming the ILD layer 109 and the first passivation layer 117 as a single layer and then performing a dual damascene process to form the vias 201 and redistribution line 303 simultaneously, may alternatively be utilized. This method and any other suitable method are fully intended to be included within the scope of the embodiments.

Additionally, a contact pad 305 may also be formed through the first passivation layer 301 and the ILD layer 109. In an embodiment the contact pad 305 may be formed by initially forming an opening through the first passivation layer 301 and the ILD layer 109 using, e.g., a suitable photolithographic and etching process. The opening through the first passivation layer 301 may then be filled with, e.g., the first conductive material 106 using a suitable plating process, such as electroplating, in order to plate the contact pad 305 to the upper metallization layer 107 and fill and overfill the opening through the first passivation layer 301 and the ILD layer 109. Excess material located outside of the opening the first passivation layer 301 may then be removed using, e.g., a CMP process.

However, as one of ordinary skill in the art will immediately recognize, the precise process described above with respect to the formation of the redistribution line 303 and the contact pad 305 is merely an illustrative embodiment, and is not meant to be limiting in any fashion. Any suitable order of process steps and any other suitable materials, such as forming the contact pad 305 prior to forming the redistribution line 303, and any other suitable methods than those described above may alternatively be utilized. These and any other such orders or methods are fully intended to be included within the scope of the embodiments.

After the contact pad 305 and the redistribution line 303 have been formed, a second passivation layer 307 may be formed to help isolate and protect the contact pad 305, the redistribution line 303, and other underlying structures. In an embodiment the second passivation layer 307 may be formed from a polymer such as polyimide, or may alternatively be formed of materials such as silicon oxides, silicon nitrides, low-k dielectrics, extremely low-k dielectrics, combinations of these, and the like. The second passivation layer 307 may be formed to have a thickness of between about 2 μm and about 15 μm, such as about 5 μm.

After the second passivation layer 307 has been formed over the redistribution line 303 and the contact pad 305, the test pad 309 and the contact 311 may be formed through the second passivation layer 307. In an embodiment the test pad 309 may be formed of the third conductive material 313, such as aluminum, and may be formed by first forming an opening through the second passivation layer 307 to expose a portion of the redistribution line 303. Once the opening through the second passivation layer 307 has been formed, the test pad 309 may be formed by filling the opening with the third conductive material 313 using a process such as CVD, although any suitable process of formation, such as PVD, ALD, or the like, may alternatively be utilized. Excess material from outside of the opening through the second passivation layer 307 may be removed, utilizing, e.g., a suitable removal process such as CMP or etching, and the second passivation layer 307 may optionally be recessed so that the test pad 309 extends beyond the second passivation layer 307.

However, as one of ordinary skill in the art will recognize, the above described process for forming the test pad 309 through the second passivation layer 307 is merely illustrative and is not intended to limit the embodiments. Alternative methods, such as depositing a layer of the third conductive material 313, patterning the third conductive material 313 to form the test pad 309, forming the second passivation layer 307 over the test pad 309, and then exposing the test pad 309 through the second passivation layer 307, may also be utilized. This method and any other suitable methods may alternatively be utilized, and are fully intended to be included within the scope of the embodiments.

The contact 311 may be, e.g., a conductive pillar, and may be formed to provide conductive regions for contact between the contact pad 305 and an external device (not shown in FIG. 1) such as printed circuit boards or other semiconductor dies in, e.g., a flip-chip arrangement. The contact 311 may be formed by initially forming a second photoresist (not shown) over the second passivation layer 307 to a thickness greater than about 20 μm, or even greater than about 60 μm. The second photoresist may be patterned to expose portions of the second passivation layer 307 through which the contact 311 will extend. Once patterned, the second photoresist may then be used as a mask to remove the desired portions of the second passivation layer 307, thereby exposing those portions of the underlying contact pad 305 to which the contact 311 will make contact.

After the second passivation layer 307 has been patterned, the contact 311 may be formed within the openings of both the second passivation layer 307 as well as the second photoresist. The contact 311 may be formed from, e.g., the first conductive material 106. Additionally, the contact 311 may be formed using a process such as electroplating, by which an electric current is run through the contact pad 305 to which the contact 311 is desired to be formed, and the contact pad 305 is immersed in a solution. The solution and the electric current deposit the first conductive material 106, e.g., copper, within the openings in order to fill and/or overfill the openings of the second photoresist and the second passivation layer 307, thereby forming the contact 311. Excess first conductive material 106 outside of the opening may then be removed using, for example, a chemical mechanical polish (CMP).

After the contact 311 has been formed, the second photoresist may be removed through a process such as ashing, whereby the temperature of the second photoresist is increased until the second photoresist decomposes and may be removed. After the removal of the second photoresist, the contact 311 may extend away from the second passivation layer 307 a first distance $d_1$ of between about 5 μm to about 50 μm, such as 40 μm.

However, as one of ordinary skill in the art will recognize, the above described process to form the contact 311 is merely one such description, and is not meant to limit the embodiments to this process. Rather, the described process is intended to be merely illustrative, as any suitable process for forming the contact 311 may alternatively be utilized. For example, forming the second passivation layer 307 to a thickness greater than its eventual thickness, forming the contact 311 into an opening of the second passivation layer 307, and then removing a top portion of the second passivation layer 307 such that the contact 311 extends away from the second passivation layer 307, may also be utilized. All suitable processes for forming the contact 311 are fully intended to be included within the scope of the present embodiments.

Figure 4:
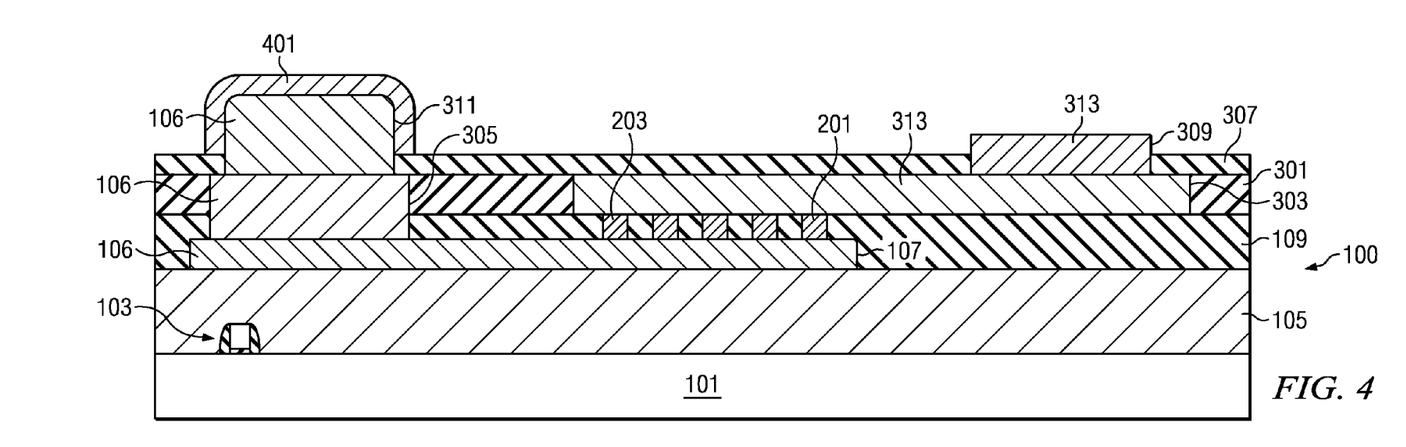
FIG. 4 illustrates the formation of a conductive layer on the contact in accordance with an embodiment.

FIG. 4 illustrates a formation of a conductive layer 401 over the contact 311. The conductive layer 401 may be formed, e.g., in a process such as an electroless nickel electroless palladium immersion gold (ENEPIG) process, in which a series of electroless plating processes are utilized to form a series of layers over the contact 311 in order to protect and provide the connective surfaces of the contact 311. As an example only, a first electroless plating process may be utilized to form a layer of nickel (not individually illustrated in FIG. 4) onto the surface of the contact 311, a second electroless plating process may be utilized to form a layer of palladium (not individually illustrated in FIG. 4), and a third electroless plating process may be utilized to form a layer of gold onto the layer of palladium.

However, as one of ordinary skill in the art will recognize, the ENEPIG process utilized in the above described embodiment is not the only embodiment that may be utilized to form the conductive layer 401. Any other suitable process, such as electroless nickel immersion gold (ENIG), electroless nickel electroless palladium (ENEP), organic solderability preservative (OSP), immersion tin (IT), immersion gold (IG), Al, Sn, Ni, Au, Ag, or other suitable electrically conductive materials may alternatively be utilized. These and any other suitable immersion processes to form the conductive layer 401 on the contact 123 may alternatively be utilized, and are fully intended to be included within the scope of the present embodiments.

However, if there is nothing to block a flow of electrons from the test pad 309 to the contact 311, a galvanic circuit may be created during the plating process between the contact 311, the immersion solutions of, e.g., the ENIPIG process, the test pad 309, and the interconnects connecting the test pad 309 back to the contact 311 (e.g., the redistribution line 303, the vias 201, the upper metallization layer 107, and the contact pad 305). This galvanic circuit could generate galvanic effects and attack and degrade the test pad 309 during the plating process.

To solve such a problem, the vias 201 may be formed with the second conductive material 203 instead of either the first conductive material 106 (used to form the upper metallization layer 107, the contact pad 305, and the contact 311) or the third conductive material 313 (used to form the redistribution line 303 and the test pad 309) in order to form a chemical potential barrier and to remove or reduce the driving force from the difference of chemical potentials. By forming the second conductive material 203 to be outside of a range of reduction potentials between the first conductive material 106 and the third conductive material 313 (e.g., have either a lower reduction potential than the first conductive material 106 or a higher reduction potential than the third conductive material 313), the second conductive material 203 may be used to effectively block the flow of electrons along the electrical path from the test pad 309 to the contact 311. For example, if the second conductive material 203 has a reduction potential greater than the third conductive material 313 (e.g., if the second conductive material 203 is magnesium while the third conductive material 313 is aluminum), then the inclusion of the second conductive material 203 generates a barrier to the flow of electrons by increasing the reduction potential in the path between the third conductive material 313 (located in the redistribution line 303) and the second conductive material 203 (located in the vias 201).

Alternatively, if the second conductive material 203 has a reduction potential less than the reduction potential of the first conductive material 106 (e.g., if the second conductive material 203 is platinum while the first conductive material 106 is copper), then the increase in reduction potential between the second conductive material 203 and the first conductive material 106 generates a barrier to the flow of electrons by increasing the reduction potential in the path between the second conductive material 203 (located in the vias 201) and the first conductive material 106 (located in the upper metallization layer 107). By generating such a barrier, the flow of electrons from the test pad 309 to the contact 311 during the plating process to form the conductive layer 401 may be reduced or eliminated. Such a reduction will lead to a reduction in the degradation of the test pad 309, leading to a more efficient and overall better process.

By utilizing the second conductive material 203 in order to provide a barrier during the plating of the contact 311, the semiconductor device 100 may avoid a galvantic circuit and prevent damage to the test pad 309 during the plating process. Additionally, by blocking the galvantic circuit, the use of a photoresist to protect the test pad 309 during the plating process is no longer necessary, thereby preventing any leaching of the photoresist chemicals into the immersion solutions during the plating process. Additionally, without a photoresist, the entire exposed surface of the contact 311 (instead of merely the top of the contact 311) may be plated and protected, thereby also preventing subsequent etching process from etching the sides of the contact 311 and reducing the formation of eaves underneath along the sidewalls of the contact and also preventing undesired particles from breaking off during the subsequent etch. All of these may lead to a more efficient, more controlled, and less costly process of forming the conductive layer 401 on the contact 311.

Figure 5:
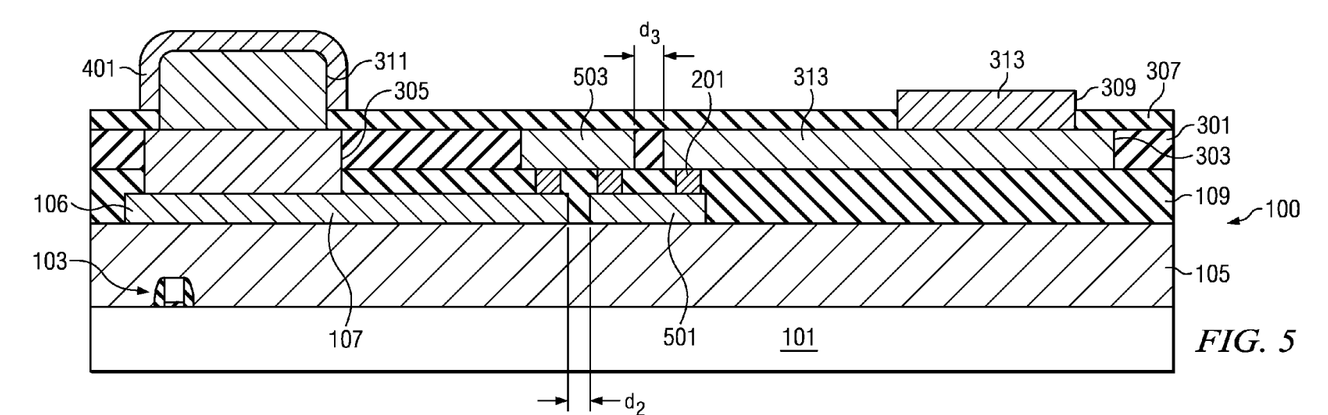
FIG. 5 illustrates a structural block in the semiconductor device in accordance with an embodiment.

FIG. 5 illustrates another embodiment in which the physical layout of the upper metallization layer 107 and the redistribution line 303 may be modified to take advantage of the reduction potentials of the first conductive material 106 and the third conductive material 313 to block the flow of electrons without the use of the second conductive material 203. In this embodiment a first conductive connector 501 may be formed with the upper metallization layer 107 but spaced apart from the upper metallization layer 107. The first conductive connector 501 may be formed utilizing the same materials (e.g., the first conductive material 106) and the same processes as the upper metallization layer 107, but is separated from the upper metallization layer 107 by a portion of the ILD layer 109. The first conductive connector 501 may be spaced from the upper metallization layer 107 a second distance $d_2$ of between about 1 μm and about 9000 μm, such as about 100 μm.

Once the first conductive connector 501 has been formed with the upper metallization layer 107 and separated from the upper metallization layer 107 by the ILD layer 109, the vias 201 may be formed through the ILD layer 109, with at least two of the vias 201 connecting to the first conductive connector 501 and at least one of the vias 201 in electrical contact with the upper metallization layer 107. The vias 201 may be formed from either the first conductive material 106 (e.g., copper) or the third conductive material 313 (e.g., aluminum), but does not have to be formed from the second conductive material 203.

Once the vias 201 have been formed in the ILD layer 109, a second conductive connector 503 may be formed along with the redistribution line 303 but spaced apart from the redistribution line 303. In an embodiment the second conductive connector 503 may be formed utilizing the same materials (e.g., the third conductive material 313) and the same processes as the formation of the redistribution line 303, for example, forming an opening and then depositing aluminum with a CVD process. However, any other suitable process may alternatively be utilized to form the second conductive connector 503. The second conductive connector 503 may be spaced from the redistribution line 303 a third distance $d_3$ of between about 1 μm and about 9000 μm, such as about 100 μm.

The second conductive connector 503 may additionally be formed in order to connect a via 201 connected to the first conductive connector 501 to a via 201 connected to the upper metallization layer 107. By forming the second conductive connector 503, the first conductive connector 501 and the vias 201 as described, the electrical path between the test pad 309 and the contact 311 will alternate between the third conductive material 313 and the first conductive material 106, causing a break in the galvanic circuit to be formed wherever the electrical path alternates from the first conductive material 106 (with a low reduction potential, such as copper) to the third conductive material 313 (with a high reduction potential, such as aluminum). Accordingly, by adjusting the structure of the upper metallization layer 107 and the redistribution line 303, the galvanic effects that may occur during the plating of the conductive layer 401 may be reduced without the introduction of the second conductive material 203.

For example, in an embodiment in which the first conductive material 106 is copper and the third conductive material 313 is aluminum and in which the vias 201 are formed from the first conductive material 106 of copper, the flow path between the test pad 309 and the contact 311 comprises, in order, aluminum (in the test pad 309 and the redistribution line 303), copper (in the via 201), copper (in the first conductive connector 501), copper (in the via 201), aluminum (in the second conductive connector 503), copper (in the via 201), and copper (in the upper metallization layer 107, the contact pad 305, and the contact 309). As such, the increase in the reduction potential between the copper (in the via 201 connecting the first conductive connector 501 and the second conductive connector 503) and the aluminum (in the second conductive connector 503) provides a barrier to the flow of electrons, and can reduce or eliminate damage to the test pad 309 that can occur during the plating of the contact 311.

Alternatively, in an embodiment in which the first conductive material 106 is copper, the third conductive material 313 is aluminum, and the vias 201 are formed from the third conductive material 313 such as aluminum, the flow path between the test pad 309 and the contact 311 comprises, in order, aluminum (in the test pad 309 and the redistribution line 303), aluminum (in the via 201), copper (in the first conductive connector 501), aluminum (in the via 201), aluminum (in the second conductive connector 503), aluminum (in the via 201), and copper (in the upper metallization layer 107, the contact pad 305, and the contact 311). As such, the increase in the reduction potential between the copper in the first conductive connector 501 and the aluminum in the via 201 between the first conductive connector 501 and the second conductive connector 503 provides a barrier to the flow of electrons, and can reduce or eliminate damage to the test pad 309 that can occur during the plating of the contact 311. As such, regardless of whether the first conductive material 106 or the third conductive material 313 is utilized to form the vias 201 in this embodiment, a barrier to the flow of electrons is generated, and this barrier may be used to protect the test pad 309 from galvanic damage during the plating of the contact 311.

In yet another embodiment, the vias 201 may be formed from materials other than the first conductive material 106 and the third conductive material 313. For example, the second conductive material 203, while not necessary, may be utilized with the structure that includes the first conductive connector 501 and the second conductive connector 503 in order to help tune the reduction potentials within the path between the test pad 309 and the contact 311. Additionally, because the structure itself forms the barrier to electron flow, other materials than those described above for the second conductive material 203, such as tantalum (with a reduction potential of 0.6 V) or titanium (with a reduction potential of 1.63 V), may alternatively be utilized to form the vias 201. In an embodiment the vias 201 may be used in conjunction with the structure containing the first conductive connector 501 and the second conductive connector 503 in order to help protect the test pad 309 from galvanic damage.

For example, in an embodiment in which the vias 201 are formed with the second conductive material 203, such as magnesium, the first conductive material 106 is copper and the third conductive material 313 is aluminum, the flow path between the test pad 309 and the contact 311 comprises, in order, aluminum (in the test pad 309 and the redistribution line 303), magnesium (in the via 201), copper (in the first conductive connector 501), magnesium (in the via 201), aluminum (in the second conductive connector 503), magnesium (in the via 201), and copper (in the upper metallization layer 107, the contact pad 305, and the contact 311). As such, the increase in the reduction potential between the aluminum in the redistribution line 303 and the magnesium in the via 201 connecting the redistribution line 303 to the first conductive connector 501 provides a barrier to the flow of electrons. Additionally, a second barrier can be formed between the copper in the first conductive connector 501 and the magnesium in the via 201 connecting the first conductive connector 501 and the second conductive connector 503 may provide another barrier to the flow of electrons. All of the barriers described herein and the other barriers formed by utilizing the second conductive material 203 within the vias 201 may be used to reduce or eliminate damage to the test pad 309 that can occur during the plating of the contact 311.

Figure 6:
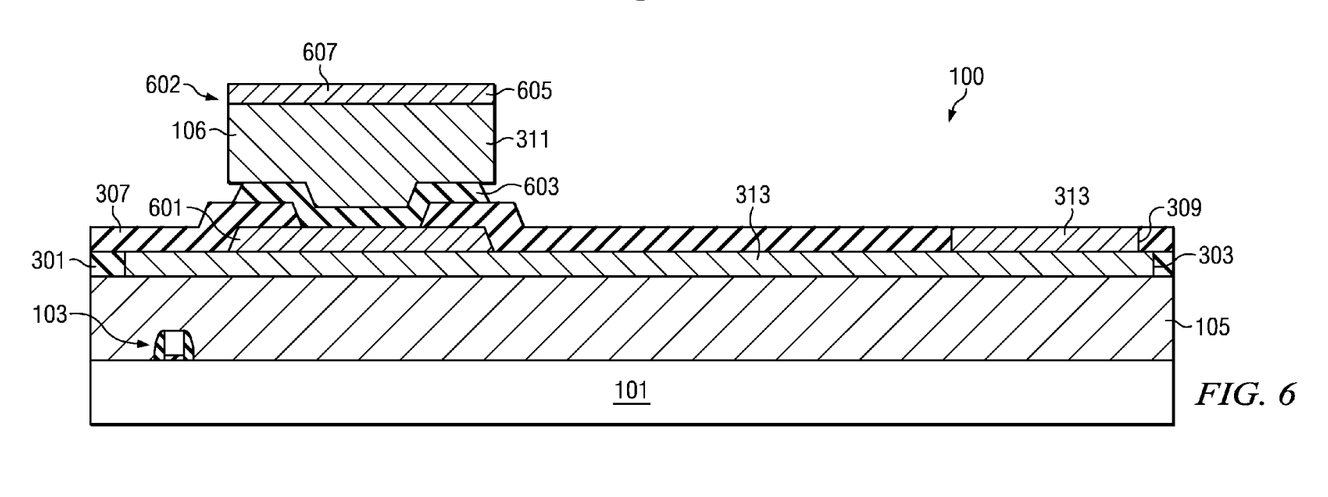
FIG. 6 illustrates another embodiment in which a blocking layer is formed in a contact stack in accordance with an embodiment.

FIG. 6 illustrates another embodiment in which the upper metallization layer 107 and the vias 201 (illustrated above with respect to FIG. 2) are removed, and the redistribution line 303 is formed to electrically connect the conductive portions of the intermediate metallization layers 105, the test pad 309, and a second contact pad 601 (discussed further below). The redistribution line 303 in this embodiment may be formed from similar materials (e.g., the third conductive material 313 such as aluminum) and in a similar manner (e.g., CVD) discussed above with respect to FIG. 3. However, other suitable materials and processes may alternatively be utilized.

After the redistribution line 303 has been formed in such a shape as to connect the conductive portions of the metallization layers 105, the test pad 309, and the second contact pad 601, the second contact pad 601 may be formed over the redistribution line 303 to provide a connection between the redistribution line 303 and the contact 311. In an embodiment the second contact pad 601 may be formed of the third conductive material 313 (e.g., aluminum) and may be formed by CVD, although other suitable materials and methods may alternatively be utilized. Once the third conductive material 313 has been deposited, the third conductive material 313 may be shaped into the second contact pad 601 using, e.g., a photolithographic masking and etching process.

After the second contact pad 601 has been formed, the second passivation layer 307 may be formed to help isolate and protect the second contact pad 601 and the redistribution line 303. The second passivation layer 307 may be formed from similar materials and using similar processes as the second passivation layer 307 discussed above with respect to FIG. 3. However, other suitable materials and processes may alternatively be utilized.

Once the second passivation layer 307 has been formed, the test pad 309 may be formed through the second passivation layer 307 to be in electrical contact with the redistribution line 303. The test pad 309 may be formed of similar materials (e.g., the third conductive material 313 such as aluminum) and from similar processes as the test pad 309 discussed above with respect to FIG. 3. However, other suitable materials and processes may alternatively be utilized.

A contact stack 602 with a barrier layer 603, the contact 311, and a first blocking layer 605 may be formed over the second contact pad 601. The barrier layer 603 may be formed through the second passivation layer 307 to electrically connect the second contact pad 601 with the contact 311 (discussed further below). The barrier layer 603 may comprise a material such as titanium, although other suitable materials, such as titanium nitride (TiNx), may alternatively be utilized. The barrier layer 603 may be formed by first forming an opening through the second passivation layer 307 using, e.g., a photolithographic masking and etching process to expose a portion of the second contact pad 601. After the second contact pad 601 has been exposed, the barrier layer 603 may be formed through a process such as CVD to make contact with the second contact pad 601, and undesired material may be removed using, e.g., an etching process to form the barrier layer 603.

After the barrier layer 603 has been formed, the contact 311 may be formed in electrical connection with the barrier layer 603. The contact 311 may be formed in a similar fashion and from similar materials (e.g., utilizing a photoresist to form an opening and plating the first conductive material 106 within the opening) as the contact 311 discussed above with respect to FIG. 3. However, other materials and processes may alternatively be utilized.

After the contact 311 has been formed, the first blocking layer 605 may be formed over the contact 311. In an embodiment the blocking layer may be formed of a fourth conductive material 607 that has a higher reduction potential than the first conductive material 106. In an embodiment the first blocking layer 605 may be a metal material such as nickel, although other suitable materials, such as tin (Sn), cobalt (Co), combinations of these, and the like, may alternatively be utilized. The first blocking layer 605 may be formed through a process such as CVD, although other process such as PVD, ALD, or the like, may alternatively be utilized. The first blocking layer 605 may be formed to a thickness of between about 0.1 μm and about 10 μm, such as about 0.5 μm.

Figure 7:
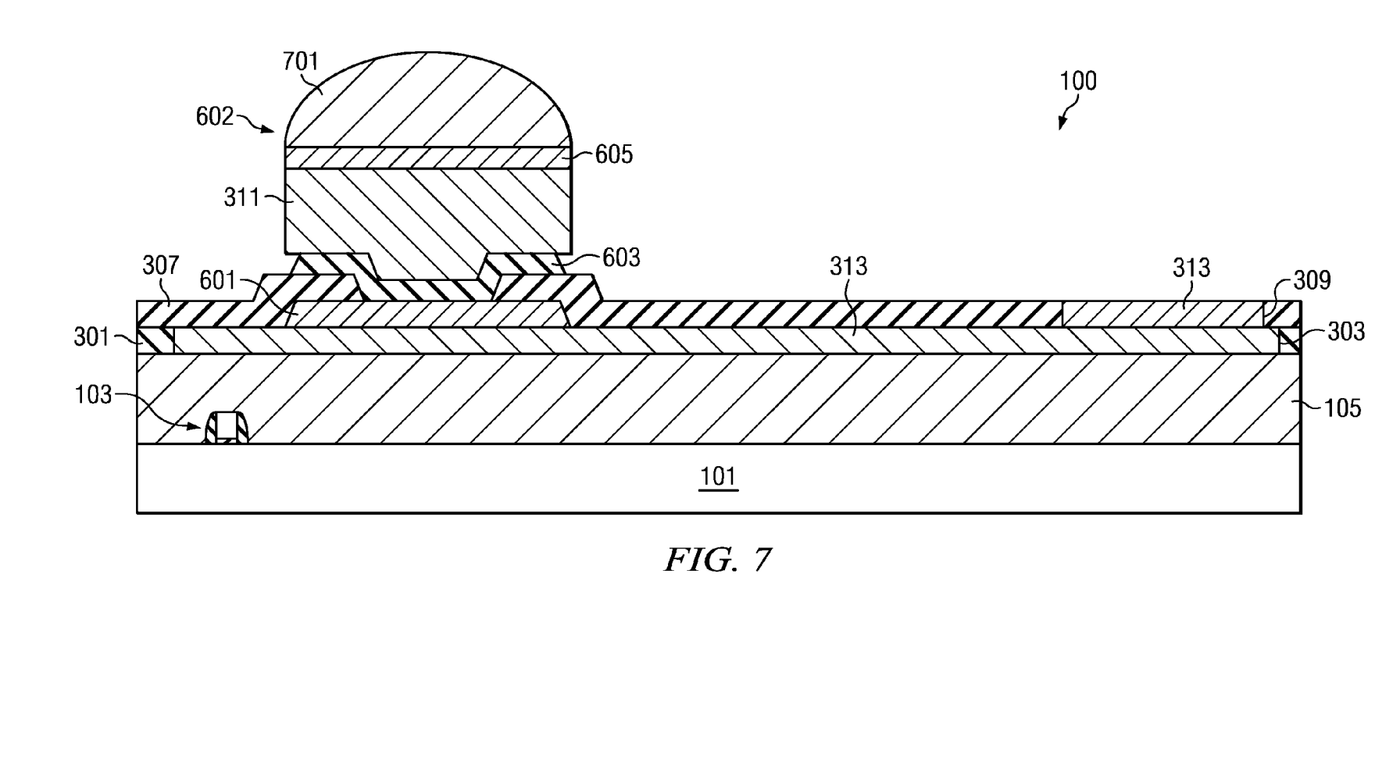
FIG. 7 illustrates the formation of a conductive material onto the contact in accordance with an embodiment.

FIG. 7 illustrates the formation of a fifth conductive material 701 onto the first blocking layer 605. The fifth conductive material 701 may comprise a material such as a tin-gold alloy, or other suitable materials, such as silver, lead-free tin, or copper. In an embodiment in which the fifth conductive material 701 is a tin-gold alloy, the fifth conductive material 701 may be formed by initially forming a layer of the tin-gold alloy through such commonly used methods such as plating, etc., to a thickness of between about 10 μm and about 30 μm, such as about 15 μm.

During the plating process to form the fifth conductive material 701, the first blocking layer 605, by covering a majority of the exposed surfaces of the contact 311, will interrupt and block the galvanic circuit that would have otherwise been formed between the contact 311 and the test pad 309. For example, by using the fourth conductive material 607 (with a higher reduction potential than the first conductive material 106 in the contact 311) to form the first blocking layer 605, the increase in reduction potential between the first conductive material 106 in the contact 311 and the fourth conductive material 607 in the first blocking layer 605 will block the flow of electrons between the contact 311 and the test pad 309 through the immersion solution during the plating process of the fifth conductive material 701, thereby preventing or reducing the galvanic effects and degradation of the test pad 309.

Once the fifth conductive material 701 has been formed on the blocking layer 605, a reflow process may be performed to transform the fifth conductive material 701 into a bump shape. In the reflow process the temperature of the fifth conductive material 701 is raised to between about 200° C. and about 260° C., such as about 250° C., for between about 10 seconds and about 60 seconds, such as about 35 seconds. This reflow process partially liquefies the fifth conductive material 701, which then pulls itself into the desired bump shape due to the fifth conductive material's 701 surface tension.

Figure 8:
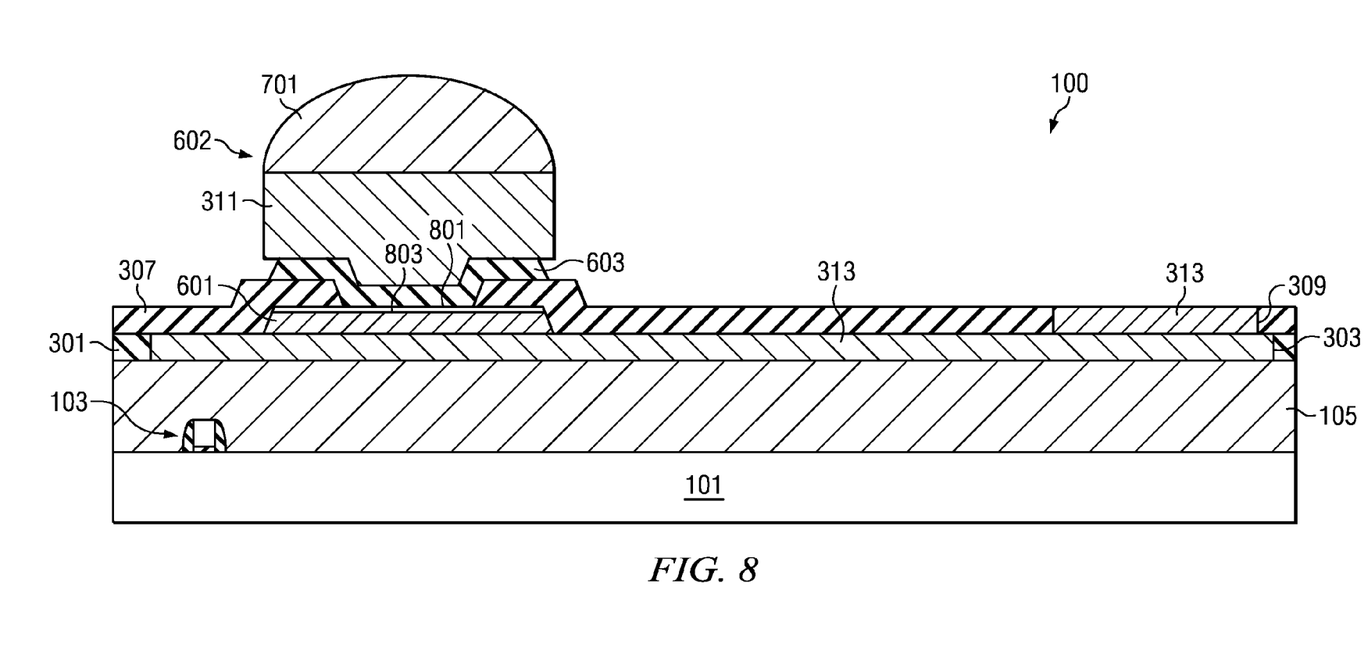
FIG. 8 illustrates another embodiment in which the blocking layer is formed over a contact pad in accordance with an embodiment.

FIG. 8 illustrates yet another embodiment in which a second blocking layer 801 is formed within the contact stack 602 embedded between the contact 311 and the second contact pad 601. In this embodiment the second blocking layer 801 may be formed of a sixth conductive material 803, such as a metal material such as tantalum, although other materials, such as copper, magnesium, zirconium, zinc, tin, niobium, iron, boron, bismuth, chromium, gallium, lead, germanium, indium, molybdenum, tungsten, silver, gold, beryllium, calcium, strontium, barium, rubidium, lithium, combinations of these, or the like, may alternatively be utilized. The second blocking layer 801 may be formed using, e.g., CVD, although any suitable process of formation may alternatively be utilized. However, the second blocking layer 801 may be formed after the formation of the second contact pad 601 and prior to the formation of the second passivation layer 307. As such, the second blocking layer 801, by interjecting the sixth conductive material 803 with a higher reduction potential than the first conductive material 106, provides a block to the flow of electrons between the third conductive material 313 (e.g., aluminum) in the second contact pad 601, the barrier layer 603 and the contact 311.

Alternatively, the second blocking layer 801 may be a composite layer formed from two separate materials (not individually illustrated in FIG. 8). In one embodiment the composite layer may comprise a first layer of the sixth conductive material 803 (e.g., titanium) and a second layer of the first conductive material 106 (e.g., copper), although any suitable combination of materials may alternatively be utilized. The first layer of the sixth conductive material 803 may be formed to a thickness of between about 0.1 μm and about 10 μm, such as about 0.5 μm, and the second layer of the first conductive material 106 may be formed to a thickness of between about 1 μm and about 50 μm, such as about 10 μm.

Figure 9:
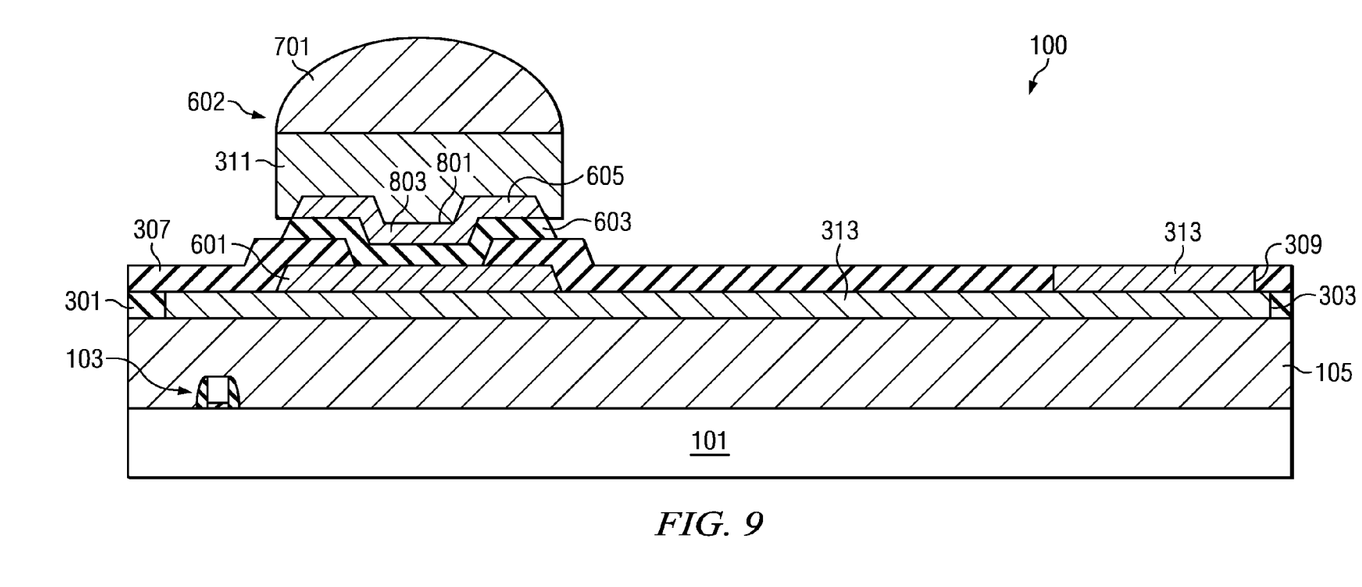
FIG. 9 illustrates another embodiment in which the blocking layer is formed over a barrier layer in accordance with an embodiment.

FIG. 9 illustrates yet another embodiment in which the second blocking layer 801, instead of being formed between the second contact pad 601 and the barrier layer 603, is instead formed between the barrier layer 603 and the contact 311. In this embodiment, the second blocking layer 801 may be formed using similar methods and materials as described above with respect to FIG. 8. For example, the second blocking layer 801 may be formed of the sixth conductive material 803 such as tantalum using a CVD process, although other materials and processes may be utilized. However, in this embodiment the second blocking layer 801 may be formed after the formation of the barrier layer 603 and prior to the formation of the contact 311. As such, the second blocking layer 801, by interjecting the sixth conductive material 803 with a higher reduction potential than the first conductive material 106, provides a block to the flow of electrons between the barrier layer 603 the contact 311. As such, the galvanic effect and degradation that would occur to the test pad 309 during the plating process for the fifth conductive material 701 may be prevented or reduced.

In accordance with an embodiment a semiconductor device comprising a contact on a substrate, the contact comprising a first material with a first reduction potential, the first reduction potential being at a first end of a range of reduction potentials, is provided. A test pad is located on the substrate, the test pad comprising a second material with a second reduction potential different from the first reduction potential, the second reduction potential being at a second end of the range of reduction potentials. At least one via electrically connects the test pad to the contact, the at least one via comprising a third material with a third reduction potential, the third reduction potential being outside of the range of reduction potentials.

In accordance with another embodiment, a semiconductor device comprising a first metallization layer on a substrate, the first metallization layer comprising a test pad redistribution line and a first conductive connector separated from the test pad redistribution line, the test pad redistribution line and the first conductive connector comprising a first material with a first reduction potential, is provided. A second metallization layer is on the substrate, the second metallization layer comprising a conductive line and a second conductive connector separated from the conductive line, the conductive line electrically connected to a contact, the conductive line and the second conductive connector comprising a second material with a second reduction potential different from the first reduction potential. A first via connects the test pad redistribution line and the second conductive connector, a second via connects the second conductive connector to the first conductive connector, and a third via connects the first conductive connector to the conductive line.

In accordance with yet another embodiment, a semiconductor device comprising a test pad on a substrate, the test pad comprising a first material with a first reduction potential, is provided. A contact pad is on the substrate, the contact pad electrically connected to the test pad. A contact stack is over the contact pad, the contact stack comprising a contact, the contact comprising a second material with a second reduction potential different from the first reduction potential, and a blocking layer comprising a third material with a third reduction potential different from the second reduction potential.

Although the embodiments and their advantages have been described in detail, it should be understood that various changes, substitutions and alterations can be made herein without departing from the spirit and scope of the embodiments as defined by the appended claims. For example, the precise materials utilized to form the blocking material or the blocking layer may be modified. Additionally, the precise order of steps utilized to form the blocking structures and materials may be modified while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
a contact on a substrate, the contact comprising a first material with a first reduction potential, the first reduction potential being at a first end of a range of reduction potentials;
a test pad on the substrate, the test pad comprising a second material with a second reduction potential different from the first reduction potential, the second reduction potential being at a second end of the range of reduction potentials, the test pad being laterally separated from the contact and the contact comprising a top surface further away from the substrate than a bottom surface of the test pad; and
at least one via electrically connecting the test pad to the contact, the at least one via comprising a third material with a third reduction potential, the third reduction potential being outside of the range of reduction potentials.

2. The semiconductor device of claim 1, wherein the third reduction potential is greater than the second reduction potential.

3. The semiconductor device of claim 1, wherein the third reduction potential is lower than the first reduction potential.

4. The semiconductor device of claim 1, wherein the first material comprises copper and the second material comprises aluminum.

5. The semiconductor device of claim 4, wherein the third material comprises magnesium.

6. The semiconductor device of claim 4, wherein the third material comprises platinum.

7. The semiconductor device of claim 1, further comprising a redistribution line electrically connecting the test pad to the at least one via.

8. A semiconductor device comprising:
a first metallization layer on a substrate, the first metallization layer comprising a test pad redistribution line and a first conductive connector separated from the test pad redistribution line, the test pad redistribution line and the first conductive connector comprising a first material with a first reduction potential;
a second metallization layer on the substrate, the second metallization layer comprising a conductive line and a second conductive connector separated from the conductive line, the conductive line electrically connected to a contact, the conductive line and the second conductive connector comprising a second material with a second reduction potential different from the first reduction potential;
a first via connecting the test pad redistribution line and the second conductive connector;
a second via connecting the second conductive connector to the first conductive connector; and
a third via connecting the first conductive connector to the conductive line.

9. The semiconductor device of claim 8, wherein the first via comprises the first material.

10. The semiconductor device of claim 8, wherein the first via comprises the second material.

11. The semiconductor device of claim 8, wherein the first material is aluminum and the second material is copper.

12. The semiconductor device of claim 8, wherein the first via comprises a third material with a third reduction potential different from the first reduction potential and the second reduction potential.

13. The semiconductor device of claim 12, wherein the third material is magnesium, the first material is aluminum, and the second material is copper.

14. The semiconductor device of claim 8, further comprising a conductive layer over the contact.

15. A semiconductor device comprising:
a test pad on a substrate, the test pad comprising a first material with a first reduction potential;
a contact pad on the substrate, the contact pad electrically connected to the test pad, wherein the test pad comprises a top surface further away from the substrate than a bottom surface of the contact pad;

a contact stack over the contact pad, the contact stack comprising:

a contact, the contact comprising a second material with a second reduction potential different from the first reduction potential; and a blocking layer comprising a third material with a third reduction potential different from the second reduction potential.

16. The semiconductor device of claim 15, wherein the blocking layer is located over the contact.

17. The semiconductor device of claim 15, wherein the blocking layer is located between the contact and the contact pad.

18. The semiconductor device of claim 17, further comprising a barrier layer located between the blocking layer and the contact pad.

19. The semiconductor device of claim 17, further comprising a barrier layer located between the blocking layer and the contact.

20. The semiconductor device of claim 15, wherein the test pad comprises aluminum, the contact comprises copper, and the blocking layer comprises nickel.

\* \* \* \* \*